United States Patent [19]

Ho et al.

[11] Patent Number: 4,915,744
[45] Date of Patent: Apr. 10, 1990

[54] HIGH EFFICIENCY SOLAR CELL

[75] Inventors: Frank F. Ho, Yorba Linda; Milton Y. Yeh, Santa Monica, both of Calif.

[73] Assignee: Applied Solar Energy Corporation, City of Industry, Calif.

[21] Appl. No.: 306,480

[22] Filed: Feb. 3, 1989

[51] Int. Cl.$^4$ .................. H01L 31/06; H01L 31/18
[52] U.S. Cl. .................................. 136/262; 437/5; 437/93; 437/132; 357/30
[58] Field of Search ............ 136/262; 437/5, 93, 437/132; 148/DIG. 59; 357/30 B, 30 J

[56] References Cited

U.S. PATENT DOCUMENTS 4,227,941 10/1980 Bozler et al. ................... 136/255

FOREIGN PATENT DOCUMENTS 61-67968 4/1986 Japan .............................. 136/262

OTHER PUBLICATIONS

S. P. Tobin et al., *Conference Record, 18th IEEE Photovoltaic Specialists Conf.*, (1985), pp. 134-139.
K. I. Chang et al., *Conference Record, 19th IEEE Photovoltaic Specialists Conf.*, (1987), pp. 273-279.
J. H. Bullock, *IEEE Trans. Electron Dev.*, vol. 36, pp. 1238-1243, (1989).
M. Kato et al., *Conference Record, 18th IEEE Photovoltaic Specialists Conference*, (1985), pp. 14-19.
S. Tobin et al., *IEEE Electron Device Letters*, vol. 9, pp. 256-258, (1988).
Y. Yeh et al., "High Volume Production of Rugged, High Efficiency GaAs/Ge Solar Cells", 20th IEEE Photovoltaic Specialists Conf., (1988).
R. E. Hart, Jr. et al., "High Altitude Current-Voltage Measurement of GaAs/Ge Solar Cells", 20th IEEE Photovoltaic Specialist Conference, (1988).

*Primary Examiner*—Aaron Weisstuch
*Attorney, Agent, or Firm*—Poms, Smith, Lande & Rose

[57] ABSTRACT

A gallium-arsenide solar cell has a germanium substrate cut at a special angle, with its surface generally perpendicular to the 001 axis, but tilted by about six to fifteen degrees toward the direction generally about half-way between the 011 and the 111 axial directions. To avoid the cascade effect the junction with the substrate may be passivated or photovoltaically inhibited by initiating vapor deposition of GaAs at a temperature below 700° C. and rapidly ramping the temperature up to normal vapor deposition temperatures. Poisoning of the GaAs layer by germanium may be prevented inexpensively by using a silicon dioxide coating on one side of the germanium substrate.

20 Claims, 2 Drawing Sheets

HIGH EFFICIENCY SOLAR CELL

FIELD OF THE INVENTION

This invention relates to improved germanium/ gallium-arsenide solar cells.

BACKGROUND OF THE INVENTION

Up to the present time it has been proposed to use either germanium or gallium-arsenide as the substrate for solar cells in which the principal active junction is formed of n-type and p-type gallium-arsenide. Substrates of gallium-arsenide have been preferred for their electrical properties in view of the problems encountered with germanium substrates. These problems have in part involved the "cascade effect", in which some of the total output arises from the junction of gallium-arsenide with the substrate, which is particularly responsive to infrared energy, and which has a relatively high temperature coefficient.

These problems, and the standard methods for making solar cells are discussed in the following articles:
1. MOCVD AlGaAs/GaAs Solar Cells, by M. Kato et al.,; Copyright 1985 IEEE; Publication No. 0160-8371/85/0000-0014;
2. High Efficiency GaAs/Ge Monolithic Tandem Solar Cells, by S.P. Tobin, et al.; IEEE Electron Device Letters, Vol. 9, No. 5, May, 1988, pp. 256-258;
3. High Volume Production of Rugged High Efficiency GaAs/Ge Solar Cells, by Y.C.M. Yeh, F. Ho, et al.; IEEE Photovoltaic Specialist Conference; Las Vegas, Nevada, September 1988;
4. High Altitude Current-Voltage Measurement of GaAs/Ge Solar Cells, by R.E. Hart, Jr., et al.; IEEE Photovoltaic Specialist Conference; Las Vegas, Nevada, September 1988.

Incidentally, concerning the abbreviations for elements which appear in the titles of the foregoing articles, and which are used to some extent in the present specification, the element "aluminum: is abbreviated to "Al"; the element "germanium" is abbreviated to Ge; the element "arsenic" is abbreviated to As; and the element "gallium" is abbreviated to Ga. The designation of a solar cell "GaAs/Ge", indicates that it is gallium-arsenide solar cell grown on a germanium substrate. As is well known in the semiconductor field, silicon and germanium are Group IV semiconductor elements, with four valence electrons, and may be made n-type with an excess for electrons by "doping" with the addition of a similar element having five valence electrons, or may be made "p-type", with a deficiency of electrons, by doping with a similar element having only three valence electrons. Gallium, a Group III element, and arsenic, a Group V element, on either side of germanium in the periodic table, have often been used for "doping" germanium; and when used together, without germanium, form gallium-arsenide which is a good semiconductor. GaAs and Ge materials have several properties with close similarity, notably lattice constant (5.6434Å vis. 5.65748Å) and thermal coefficients of expansion (5.8 $\times 10^{-6}$/° C. vs 5.8 $\times 10^{-6}$/° C.). These features make crystal growth of one substance on the other favorable.

Now, returning to the background of this invention, germanium would be preferred as a substrate for gallium-arsenide solar cells, for a number of reasons. First, germanium has greater fracture toughness than gallium-arsenide, as a substrate; an 8 mil thick germanium slice is twice as strong as a 12 mil thick gallium-arsenide slice. Cost is another factor favoring germanium as it is 30 to 40% less expensive than gallium-arsenide. Also, germanium wafers at 8 mils thick are 34% lighter in weight than 12 mil thick gallium-arsenide, and weight is an important factor for space applications, for example. However, the adverse effects mentioned above, have inhibited the use of germanium substrates.

Another problem which has been troublesome when germanium has been used, is the "self-doping" which occurs at high temperatures when the germanium substrate is exposed to the gases used to deposit gallium-arsenide. With germanium having a melting point of about 937° C., and vapor deposition of gallium-arsenide occurring at temperatures up to 780° C., some germanium may be volatilized and adversely affect the critical doping of other solar cells being processed within the same enclosed volume during production manufacturing. This effect has in the past been blocked by a special cap of gallium-arsenide, involving a process which is relatively costly.

Accordingly, the principal objects of the present invention are to overcome the problems which have been encountered with forming gallium arsenide devices on germanium substrates and to provide in this case a superior solar cell.

SUMMARY OF INVENTION

In accordance with one aspect of the present invention, the cascade effect is prevented by the formation of a photovoltaic inhibiting junction at the interface with the germanium substrate, accomplished by initiating growth at a relatively low temperature, well below the normal temperature of 740° C. to 780° C. preferred for good surface morphology.

In accordance with another important aspect of the invention, the germanium substrate is not cut in the conventional manner, substantially perpendicular to the 100 axis, tilted about three degrees toward the 110 or 111 axis; but is cut, again generally perpendicular to the 001 axis but at a substantial angle, such as between three and twenty degrees, preferably between six and fifteen degrees, in the direction approximately half way between the 111 and the 011 crystal axes.

A collateral feature of the invention involves the use of an inexpensive coating of silicon dioxide on the back of the germanium substrate to inhibit the undesired self-doping effect.

Advantages of the present invention include increased efficiency, elimination of the cascade effect, reduction of the temperature coefficient and a less expensive technique for preventing self-doping.

Other objects, features and advantages of the invention will become apparent from a consideration of the following detailed description and the accompanying drawings.

DETAILED DESCRIPTION OF PREFERRED EMBODIMENT

Radiation from the sun is at an intensity of about 135.3 milli-watts per square centimeter. Solar cells convert this incident radiation into electrical power, and the efficiency of solar cells is in the range of about fifteen percent to twenty percent, where the efficiency is defined as the ratio of electrical output power to the solar radiation incident on the solar cell.

In addition to high efficiency, other factors which are desirable for solar cells include high mechanical strength, low temperature coefficient (of output power with changes in temperature), and good resistance to reverse bias conditions.

Returning now to FIGS. 1 and 2 of the drawings, these figures show a generally conventional solar cell construction, with two important differences. These two differences include (1) the crystalline orientation of the germanium substrate 12, and the passivated or photo-inhibited interface 14 between the substrate 12 and the n-type GaAs buffer layer 16.

Figures 1, 2:
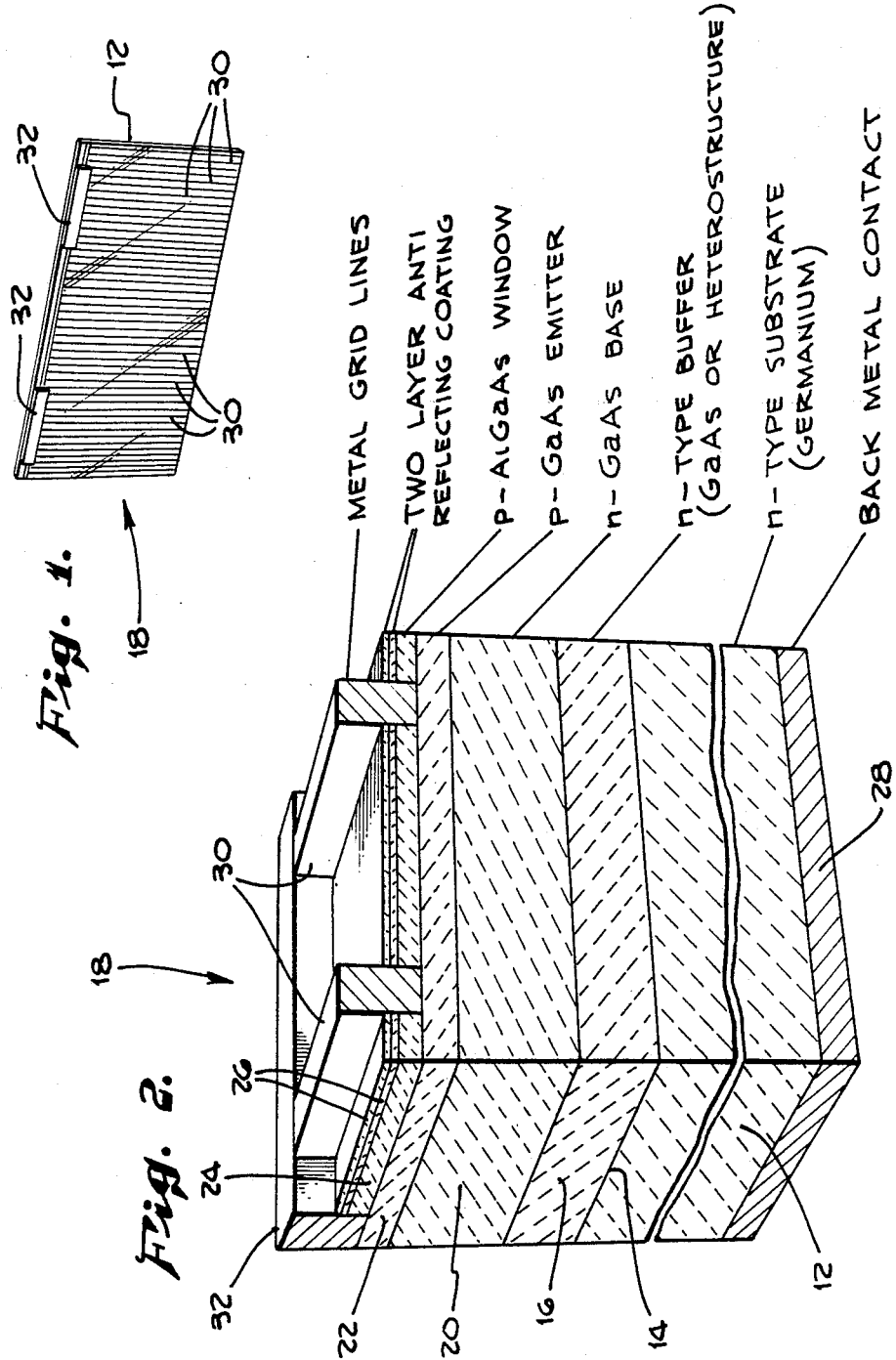
FIG. 1 is a perspective view of a solar cell.
FIG. 2 is a greatly enlarged partial cross-section of a portion of the solar cell of FIG. 1.

For completeness, however, the entire structure of the solar cell 18 of FIGS. 1 and 2 will be briefly described. More particularly, above the n-type gallium-arsenide buffer layer 16 is the n-type gallium-arsenide (GaAs) base layer 20 and the p-type GaAs emitter layer 22. The aluminum gallium-arsenide (AlGaAs) window layer 24 and the double layer anti-reflection coating 26 complete the semi-conductor structure. A full metal layer 28 is coated on the bottom of the substrate 12; and the metal grid lines 30 and the upper terminal areas 32 are on the top surface of the solar cell 18, with the grid lines permitting solar radiation to impinge on the junction between base 20 and emitter 22.

This structure is generally known and methods for forming solar cells are known and described in the articles cited hereinabove, with the exceptions noted above.

Figure 3:
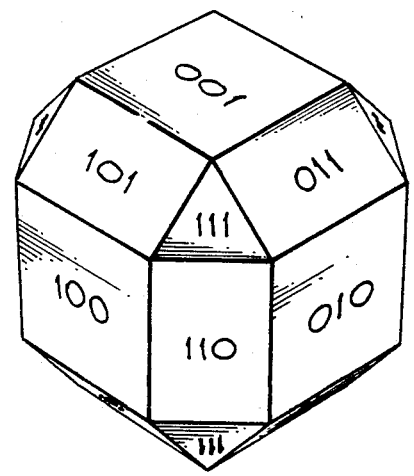
FIG. 3 is a diagrammatic showing of the crystal axes of germanium, employed as a substrate in the solar cell.
Figure 4:
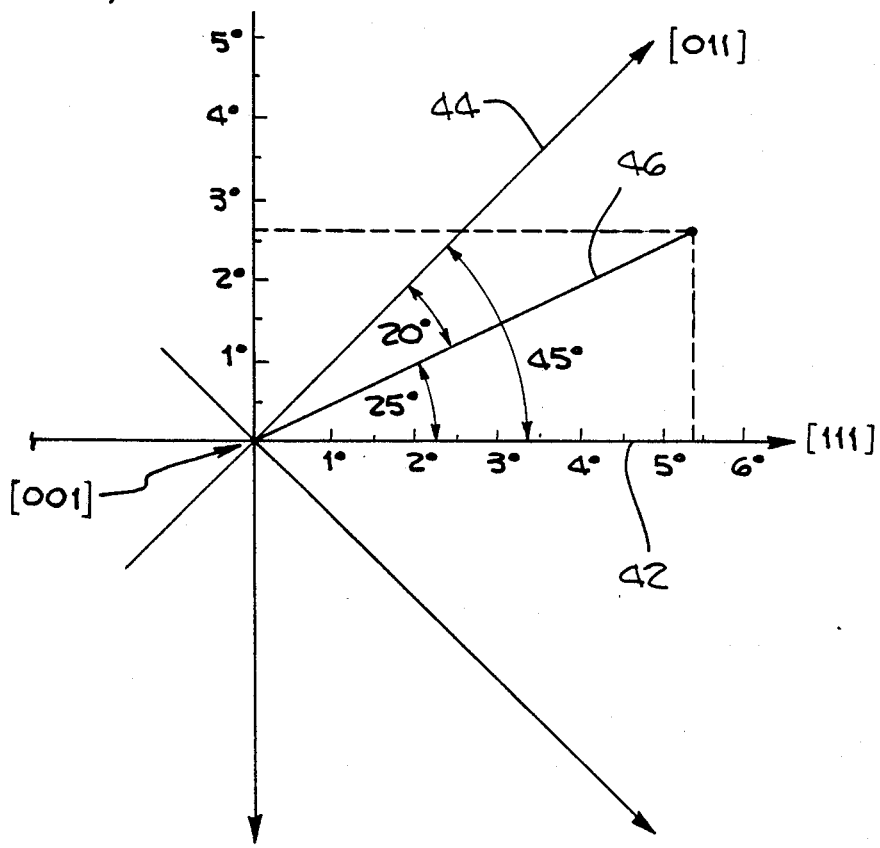
FIG. 4 is a diagram showing the orientation of the germanium substrate employed in the implementation of the invention.

FIGS. 3 and 4 are diagrams which are useful in considering the new crystal orientation of the germanium substrate, in accordance with the present invention.

In germanium crystals, there are three basic crystal axes, which may be designated the 001 axis, the 111 axis and the 011 axis. These axes are perpendicular to the faces of the geometric solid shown in FIG. 3. The 111 and the 011 axes are inclined from the 001 axis by fifty-four degrees, forty-four minutes and forty-five degrees, respectively; and the projection of the 111 and the 011 axes on a plane perpendicular to the 001 axis, as shown in FIG. 4, shows that these projections would make an angle of forty-five degrees with one another.

Adequate gallium-arsenide solar cells having a germanium substrate (GaAs/Ge cells) had previously been formed, using an angle of orientation substantially equal to the 001 direction (face of the substrate wafer perpendicular to the 001 direction) but tilted up to six degrees toward the 111 plane.

In accordance with the one aspect of the present invention, it has been determined that improved efficiency is obtained when the substrate has an angle of orientation tilted away from 001 direction at an acute angle substantially half-way between the 011 and the 111 directions, as indicated in FIG. 4 of the drawings. Specifically, in FIG. 4, the 001 direction is coming vertically out of the paper, and the projection of the 111 axis and the 011 axis on a plane perpendicular to the 001 axis are shown at reference numerals 42 and 44 respectively, making an angle of forty-five degrees with each other. The line 46 is substantially half-way between the 111 and the 011 axes, and more particularly is about twenty-five degrees for the 111 axis and about twenty degrees from the 011 axis. It has been found that, when the surface of the substrate is oriented about five to fifteen degrees from perpendicularity with the 001 direction, tilted in the direction about half-way between the 111 and the 011 axes, a significant improvement in the efficiency of the resultant solar cell is obtained. In one case, using comparative processing and a tilt angle of nine degrees, cell efficiency improved by around 20%; in another case, using the same parameters, an efficiency improvement over 20.0% was achieved. In other trials using a six degree tilt angle and again the orientation percent. In each case the comparison was made with a substantial number of concurrently treated solar cells having substrates oriented as specified in the preceding paragraph. An average solar cell efficiency of 19.1% was obtained with one 22 sample test using the nine degree tilt angle and the FIG. 4 orientation.

We will now consider the interface 14 between the n-type germanium substrate 12, and the n-type gallium-arsenide buffer 16, as shown in FIG. 2 of the drawings.

Deposition of gallium-arsenide is typically accomplished using trimethyl gallium, or $(CH_3)_3$ Ga and arsine, or $AsH_3$, in a hydrogen carrier. Normally, in order to have good surface morphology it is customary to start vapor deposition at about 740° C. and to increase the temperature to perhaps 780°C., or in all events to stay within this range for good vapor deposition of the gallium-arsenide. Incidentally, in passing, it is noted that gallium-arsenide has a melting temperature of approximately 1,238° C., while germanium has a melting point of approximately 937° C. When conventional deposition techniques are employed, good surface morphology is obtained, and a "good" photovoltaic cascade junction is developed at the interface of 14, as shown in FIG. 2. However, as discussed above, the presence of such a junction, which is primarily responsive to infrared energy, creates several problems, including the high temperature coefficient, and a "kink" in the current voltage output characteristic which effectively reduces the power output and the efficiency of the unit, as discussed in some detail in the articles cited hereinabove.

In order to inhibit or to passivate the photovoltaic effect at the junction 14, in accordance with another aspect of the invention, the starting temperature at which the gallium-arsenide layer 16 is initially deposited is selected to be well below the normal range of 740° C. to 780° C. and preferably below 700° C. More specifically, starting at 660° C, and ramping rapidly up to 748° C., where the complete layer is formed, successful results have been achieved, with the photovoltaic effect at junction 14 being substantially passivated or inhibited.

However, usually in growing GaAs layers under these low temperature conditions on germanium crystals oriented close to the 001 direction reduced crystalline perfection (poor surface morphology) was observed, and the resulting cells were of poor efficiency. The combination of correct orientation and low temperature growth have good cell performance.

Concerning another collateral aspect of the invention, as mentioned hereinabove, in a continuous process in which the solar cells are being formed, the germanium substrate, particularly the back surface thereof, may be volatilized and become deposited along with some of the gallium-arsenide or other layers in the overall solar cell. To prevent this from occurring, it has previously been proposed to deposit on the backside of the germanium substrate a coating of gallium-arsenide in a relatively expensive process. However, in accordance with this subordinate aspect of the present invention, the rear surface of the germanium substrate 12 is coated with silicon dioxide, in a simple chemical vapor deposition process which takes place at about 400° C., in which silane gas and oxygen are applied to the rear surface of the germanium substrate. Subsequently, in a later step after the solar cell junction has been formed, this silicon dioxide layer may be removed by hydrofluoric acid, so that the back metal contact may be formed.

In reviewing the method by which solar cells in accordance with the present specification are formed, the method includes the following steps:

1. Preparing a germanium substrate having the face of the substrate wafer substantially perpendicular to the 001 crystalline axis but tilted in the order of five degrees to fifteen degrees toward an angle approximately halfway between the 111 and the 011 directions.
2. Depositing a coating of silicon dioxide on one side of the germanium substrate.
3. Vapor deposition of a gallium-arsenide n-type buffer layer starting at a temperature below 700° C., but ramping the temperature up at a rapid rate as deposition progresses to a temperature of between 740° C. and 780° C. to form a non-photovoltaic junction.
4. Depositing additional semi-conductor layers to form a gallium-arsenide solar cell junction.
5. Removing the silicon dioxide layer by acid-etching.
6. Applying a back-metal contact to the germanium substrate previously coated with silicon dioxide.
7. Applying metal grid lines and contact areas to the upper surface of the solar cell.

For completeness, certain other aspects of the technology may be noted. Specifically, the discussion of the crystal orientation of the germanium from which the substrate is made, has been in terms of the 001 crystal orientation and the two adjacent crystal axes, the 011, and the 111 axes. However, there are six crystal orientations which are equivalent to the 001 direction, and these correspond essentially to the mutually orthogonal faces of a cube. In this regard, directing attention to FIG. 3 of the drawings, the 001 orientation is indicated at the upper surface of the Figure, and two equivalent axes, the 100 and the 010 orientations are visible in FIG. 3. The three additional sides which are parallel to these three sides, but which are on the opposite sides of the geometric figure as shown in FIG. 3, are each equivalent to the 001 direction, and germanium substrates could be formed using any of these axial orientations as the basic orientation but tilting toward an angle halfway between two of the adjacent axes. In this regard, for example, the 010 basic direction could be selected, with the face of the germanium substrate substantially perpendicular to the 010 direction, but tilted toward a direction substantially half-way between the 110 and 111 axes. Accordingly, in the present specification and claims, when reference is made to the 001 axis and to the adjacent axes, it is to be understood that any of the six basic orientations are encompassed, and that the tilting from these basic orientations may be half-way between any two adjacent axes, as discussed hereinabove.

For completeness, the dimension of the solar cell of FIG. 1 may be noted, although they are not critical. The solar cell as shown in FIG. 1 is approximately 8 mils thick, with the bulk of the thickness being that of the germanium substrate. The length of the representative cell shown in FIG. 1 happens to be about 1 9/16 inch, and its width happens to be about 25/32 inch. It is contemplated that the thickness of the cells will be reduced, and a 3 mil thickness will probably be used. The surface area of the cells may of course vary, and the size noted above is one convenient size which is being used.

In conclusion, it is to be understood that the foregoing detailed description and the accompanying drawings relate to one preferred embodiment and method illustrating the principles of the present invention. Various changes and modifications may be made without departing from the principles of the invention. Thus, by way of example and not of limitation, the solar cell may be of different thicknesses and dimensions other than those as specified herein; the surface grid lines and contact axes may have different configurations than that shown in the drawings; different forms of anti-reflecting and window coatings may be used other than those disclosed herein; and other methods of inhibiting the photovoltaic action adjacent the germanium substrate may be employed. In addition, instead of using an n-type germanium substrate, and n-type materials including an n-type base and an upper p-type emitter, the polarities may be reversed, using a p-type germanium substrate, additional p-type layers including a p-type GaAs base, and an upper n-type GaAs emitter and n-type window. Accordingly, the present invention is not limited to the specific structure or method as set forth in the foregoing detailed description and as illustrated in the drawings.

What is claimed is:

1. A high efficiency solar cell comprising:
   a germanium substrate having a front surface and a back surface;
   a back-metal contact on the back surface of said substrate;
   a buffer layer having a photovoltaic inhibited junction with the front surface of said substrate;
   said cell including a gallium-arsenide base of one conductivity type on said buffer layer;
   a gallium-arsenide emitter of the other conductivity type on said base;
   metal grid lines extending over and being coupled to said emitter; and
   said germanium substrate having the front face thereof oriented approximately three degrees to twenty degrees away from perpendicularity relative to the 001 crystal axis, toward an angle in the order of half-way between the 111 and the 011 crystal axes.

2. A solar cell as defined in claim 1 in which said substrate is oriented at about six degrees to fifteen degrees away from perpendicularity with the 001 crystal axis.

3. A solar cell as defined in claim 1 in which said substrate is oriented at substantially nine degrees away from perpendicularity with the 001 crystal axis.

4. A solar cell as defined in claim 1 wherein the orientation away from perpendicularity relative to the 001 axis is toward a direction within fifteen degrees of said angle half-way between said 111 and 011 axes.

5. A solar cell as defined in claim 1 wherein said base is formed of n-type gallium arsenide, and said emitter is formed of p-type gallium arsenide.

6. A high efficiency solar cell comprising:

a germanium substrate having a front face and a back surface;

a back-metal contact on the back surface of said substrate;

a gallium-arsenide layer deposited on the front face of said substrate;

said solar cell including an n-type gallium-arsenide base and a p-type gallium arsenide emitter;

metal grid lines extending over and being coupled to said emitter; and said germanium substrate having the front face thereof oriented approximately three degrees to twenty degrees away from perpendicularity relative to the 001 crystal axis, toward an angle in the order of half-way between the 111 and the 011 crystal axes.

7. A solar cell as defined in claim 6 wherein the junction formed between said substrate and said gallium arsenide layer is passivated to inhibit photovoltaic action.

8. A solar cell as defined in claim 6 wherein said substrate is oriented at about six degrees to fifteen degrees away from perpendicularity with the 001 crystal axis.

9. A method of forming a high efficiency solar cell comprising the steps of:

preparing a germanium substrate having a front face and a back surface, and having the front thereof substantially perpendicular to the 001 crystalline axis but tilted in the order of three degrees to twenty degrees toward an angle approximately half-way between the 111 and the 011 axes;

forming a buffer layer of gallium arsenide on the front face of said substrate with a non-photovoltaic junction therebetween;

depositing additional semi-conductor layers on said buffer layer to form a gallium-arsenide solar cell junction;

applying a back-metal contact to the back surface of the germanium substrate; and applying metal grid lines and contact areas to the upper surface of the solar cell.

10. A method as defined in claim 9 including the additional steps of coating the back surface of the germanium substrate with silicon dioxide prior to applying the back metal contact to said back surface of said substrate.

11. A method as defined in claim 9 wherein said germanium substrate is prepared with the face of the substrate tilted in the order of six degrees to fifteen degrees away from perpendicularity with the 001 crystal axis.

12. A method as defined in claim 9 wherein said germanium substrate is prepared with the face of the substrate tilted at an angle of substantially nine degrees away from perpendicularity with the 001 crystal axis.

13. A method for forming a solar cell as defined in claim 9 wherein said substrate is prepared using a tilt at an angle within fifteen degrees of the angle half-way between said 111 and 011 axes.

14. A method as defined in claim 9 wherein said step of forming a buffer layer includes vapor depositing a gallium-arsenide n-type buffer layer starting at a temperature below 700° C., but ramping the temperature up at a rapid rate as deposition progresses to a temperature of between 740° C. and 780°C.

15. A method of forming a high efficiency solar cell comprising the steps of:

preparing a germanium substrate having a front face and a back surface and having the front face thereof substantially perpendicular to the 001 crystalline axis but tilted in the order of three degrees to twenty degrees toward an angle approximately half-way between the 111 and the 011 axes;

depositing a plurality of semi-conductor layers over said front face to form a gallium-arsenide solar cell junction;

applying a back-metal contact to the back surface of the germanium substrate; and applying metal grid lines and contact areas to the upper surface of the solar cell.

16. A method as defined in claim 15 including the additional steps of coating the back surface of the germanium substrate with silicon dioxide prior to applying the back metal contact to said back surface of said substrate.

17. A method as defined in claim 15 wherein said germanium substrate is prepared with the front face of the substrate tilted in the order of six degrees to fifteen degrees away from perpendicularity with the 001 crystal axis.

18. The method as defined in claim 15 wherein said germanium substrate is prepared with the front face of the substrate tilted at an angle of substantially nine degrees away from perpendicularity with the 001 crystal axis.

19. A method for forming a solar cell as defined in claim 15 wherein said substrate is prepared using a tilt at an angle within fifteen degrees of the angle half-way between said 111 and 011 axes.

20. A high efficiency solar cell comprising:

a germanium substrate having a front face and a back surface, said front face being oriented approximately three degrees to twenty degrees away from perpendicularity relative to the 001 crystal axis toward an angle in the order of half way between the 111 and the 011 crystal axes;

a gallium arsenide solar cell including a p-n junction deposited on the front face of said substrate, and having a first layer of gallium arsenide of one conductivity type located closest to said substrate and a second layer of gallium arsenide of the opposite conductivity type located further away from said substrate;

a back metal contact on the back surface of said substrate; and metal grid lines overlying said gallium arsenide solar cell having a p-n junction, said metal grid lines being coupled to said second layer of gallium arsenide.

* * * * *